(12) United States Patent
Kinget et al.

(10) Patent No.: US 6,281,721 B1
(45) Date of Patent: Aug. 28, 2001

(54) PROGRAMMABLE FREQUENCY DIVIDER

(75) Inventors: Peter R. Kinget, Aliso Viejo, CA (US); Nagendra Krishnapura, New York, NY (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/511,987

(22) Filed: Feb. 24, 2000

(51) Int. Cl.[7] ................................................. H03K 21/00
(52) U.S. Cl. ............................. 327/115; 327/117; 327/147
(58) Field of Search .................................... 327/115, 117, 327/147, 156, 231, 234, 235, 237, 238; 377/47, 48

(56) References Cited

U.S. PATENT DOCUMENTS

| 5,781,054 | * | 7/1998 | Lee ........................................ 327/231 |
| 6,052,034 | * | 4/2000 | Wang et al. ............................. 331/2 |
| 6,111,470 | * | 8/2000 | Dufour .................................. 331/17 |

OTHER PUBLICATIONS

A Low Power Truly–modular 1.8GHz Programmable Divider in Standard CMOS Technology, Cicero Vaucher and Zhenhua Wang, Philips Research Labs Eindhoven, Philips Semiconductors Zurich, pp. 406–409.

A 5.3 GHz Programmable Divider for HiPerLAN in 0.25μm CMOS, N. Krishnapura, P. Kinget, Bell Laboratories, Lucent Technologies, Murray Hill, NJ 07974, USA, pp. 142–145.

* cited by examiner

*Primary Examiner*—Tuan T. Lam
*Assistant Examiner*—Hiep Nguyen (57) ABSTRACT

We have recognized that the design and programming complexity associated with conventional frequency divider configurations can be significantly reduced by a configuration of functionally identical, modular division blocks which are each able to swallow at least one input cycle of a input signal by switching to a phase-lagging output once per output cycle. The number of input pulses swallowed when a division block switches to a lagging waveform is a direct function of the division block's location in the chain, such that the number of input cycles swallowed per phase switch increases moving down the chain of division blocks. Therefore, the chain of division blocks has discrete elements for achieving most-significant to least-significant division factor increments. The total number of input cycles swallowed by the chain of division blocks equals the sum of cycles swallowed by each division block. Thus, to achieve a variety of division factors, a controller controls which, if any, division blocks switch to a phase-lagging waveform once each output cycle. Furthermore, we have recognized that the range of division factors which may be achieved by the chain of frequency dividers can be increased by controlling at least one division block to switch to a phase-leading waveform once each output cycle.

32 Claims, 5 Drawing Sheets

PROGRAMMABLE FREQUENCY DIVIDER

TECHNICAL FIELD

This invention relates to programmable frequency dividers and frequency synthesizers.

BACKGROUND OF THE INVENTION

It is well known that programmable frequency dividers are commonly used in phase-lock-loop (PLL) frequency synthesizers, such as for generating a local oscillating signal in a receiver or a carrier signal in a transmitter. One conventional type of programmable frequency divider is a phase-switching-type frequency divider which includes a) a prescaler which divides the frequency of an input waveform, $f_{in}$, by two, b) a divide-by-two circuit which divides the frequency of the prescaler output by two and outputs four phase-offset versions of $f_{in}/4$— offset by 0°, 90°, 180°, and 270° respectively, c) a multiplexer for selectively switching between the four outputs of the divide-by-two circuit, d) a divide-by-N circuit for dividing the frequency of the waveform output by the multiplexer by N, e) a pulse generator for generating K pulses per output cycle of the frequency divider, f) a four-state counter for incrementing after each pulse of the pulse generator, and g) a decoder for controlling the multiplexer based on the four-state counter output. To swallow one cycle of $f_{in}$ and thereby increase the division factor of the frequency divider by one, the multiplexer switches to an output of the divide-by-two circuit which lags the previously selected output by 90°. If the decoder controls the multiplexer to switch to a 90° lagging output K times per output cycle of the frequency divider, i.e., each time the counter increments, K input cycles are swallowed and the division factor becomes 4N+K To achieve programmability, the pulse generator must be able to generate various numbers of pulses each output cycle, depending on K. Designing and programming such a pulse generator is complicated. Also, for large values of K, the pulse generator, the divide-by-four counter, and the decoder must operate at high frequencies, thereby increasing power consumption.

SUMMARY OF THE INVENTION

We have recognized that the design and programming complexity associated with conventional frequency divider configurations can be significantly reduced in accordance with the principles of the invention, in which a programmable frequency divider includes a chain of functionally identical, modular division blocks which are each able to swallow at least one input cycle by switching to a phase-lagging output once per output cycle. The number of input pulses swallowed when a division block switches to a phase-lagging waveform is a direct function of the division block's location in the chain, such that the number of input cycles swallowed per phase switch increases moving down the chain of division blocks. Therefore, the chain of division blocks has discrete elements for achieving most-significant to least-significant division factor increments, and the total number of input cycles swallowed by the chain of division blocks equals the sum of cycles swallowed by each division block. Thus, to achieve a variety of division factors, a controller controls which, if any, division blocks switch to a phase-lagging waveform once each output cycle.

In one exemplary embodiment of the invention, a frequency divider includes a divide-by-two prescaler, a chain of functionally identical, modular divide-by-two blocks following the prescaler, and a controller. Each divide-by-two block includes a divide-by-two circuit which outputs four waveforms that are offset by 0°, 90°, 180°, and 270° respectively, and a multiplexer which selects one waveform output based on a control signal received from the controller. Control bits $b_M, \ldots, b_0$ are set according to the desired division factor and converted by the controller to a multiplexer control signal for each divide-by-two block. Division factors varying from $2^{M+2}$ to $2^{M+2}+2_{M+1}-1$ can be achieved using a chain of M+1 division blocks by setting each control bit $b_M, \ldots, b_0$ to either 1 or 0.

We have further recognized that switching to a phase-leading waveform will shorten a pulse of a waveform, and that the controller can control a divide-by-two block to switch to a phase-leading waveform once per output cycle to achieve certain division factors which are less than $2^{M+2}$. Therefore, a frequency divider structure with M+1 divide-by-two blocks can achieve division factors that are less than $2^{M+2}$, but which cannot be achieved with a frequency divider structure with less than M+1 divide-by-two stages. Setting a control bit $b_{MR}$ to 1 or 0 instructs the controller to selectively control the multiplexer of the last divide-by-two block to switch to a phase-leading waveform each output cycle.

Advantageously, various division factors may be readily achieved according to the principles of the present invention by selecting a number of division blocks, deciding whether the last division block should switch to a phase-leading output once per output cycle, and determining which, if any, division blocks should switch to a phase-lagging output once per output cycle. In this way, the frequency divider of the present invention is scalable and easily programmable, and does not require a pulse generator to control phase switching. Furthermore, because each multiplexer switches to a different output at most once per output cycle, most elements of the frequency divider operate at relatively low frequency, thereby reducing power consumption.

DETAILED DESCRIPTION

Figure 1:
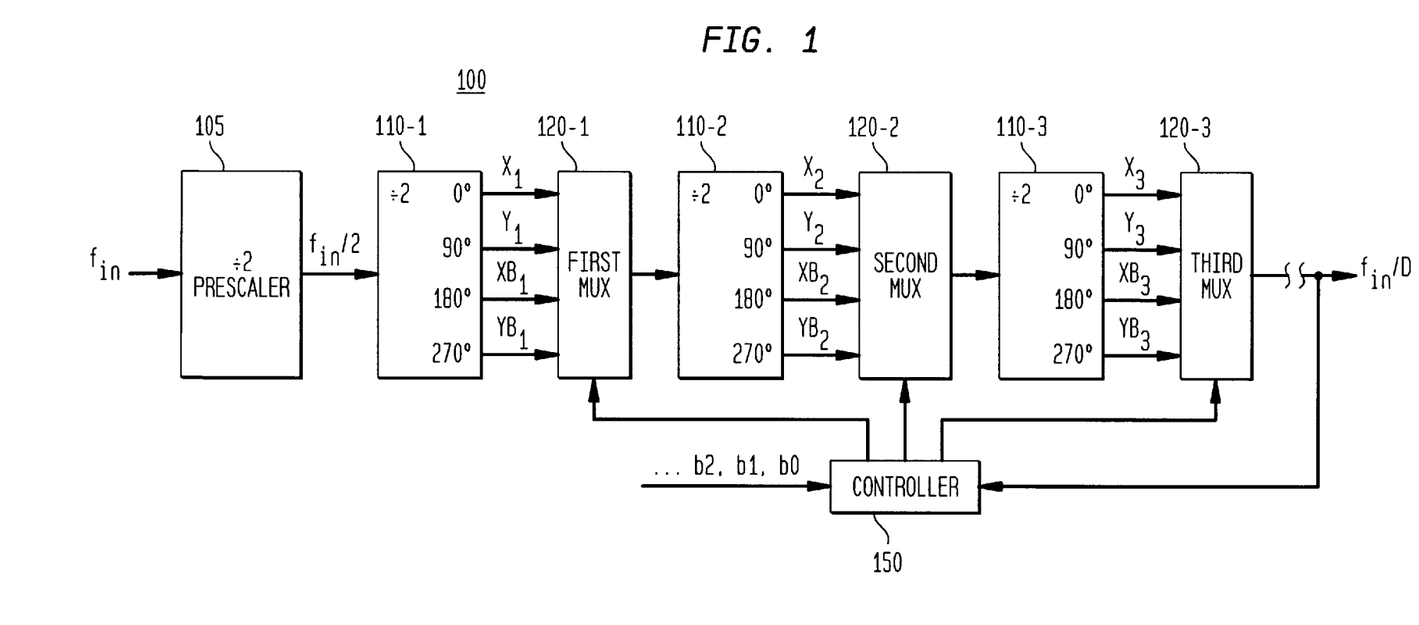
FIG. 1 shows an exemplary frequency divider structure in accordance with the principles of the present invention.

FIG. 1 shows an exemplary programmable frequency divider 100 which may be scaled and directly programmed to achieve a desired division factor in accordance with the principles of the invention. Frequency divider 100 includes 1) prescaler 105, 2) first divide-by-two circuit 110-1, 3) second divide-by-two circuit 110-2, 4) third divide-by-two circuit 110-3, 5) first multiplexer 120-1, 6) second multiplexer 120-2, 7) third multiplexer 120-3, and 8) controller 150. As described in more detail below, although three divide-by-two blocks (a "block" being a combination of a divide-by-two circuit and a multiplexer) are shown in the exemplary embodiment of FIG. 1, frequency divider 100 can be easily scaled to include additional or fewer divide-by-two blocks, depending on the desired division factor.

Prescaler 105 receives a reference frequency, $f_{in}$, and divides $f_{in}$ by two. First divide-by-two circuit 110-1 receives $f_{in}/2$ from prescaler 105, divides $f_{in}/2$ by two, and outputs four phase-offset versions of $f_{in}/4$, specifically, $f_{in}/4$ at 0° phase-offset ($X_1$), $f_{in}/4$ at 90° lagging ($Y_1$), $f_{in}/4$ at 180° lagging ($XB_1$), and $f_{in}/4$ at 270° lagging ($YB_1$). Divide-by-two circuits which output four phase-offset waveforms have been used in prior art frequency dividers and are well known. Any suitable device may be used as a divide-by-two circuit in the present invention, e.g., a master-slave flip-flop. First multiplexer 120-1 receives $X_1$, $Y_1$, $XB_1$, and $YB_1$ from first divide-by-two circuit 110-1, and outputs one of $X_1$, $Y_1$, $XB_1$, and $YB_1$ in accordance with a control signal received from controller 150.

Second divide-by-two circuit 110-2 receives the $f_{in}/4$ waveform output by first multiplexer 120-1 and divides the $f_{in}/4$ waveform by two. Second divide-by-two circuit 110-2 outputs four phase-offset versions of the resulting $f_{in}/8$ waveform, specifically, $f_{in}/8$ at 0° phase-offset ($X_2$), $f_{in}/8$ at 90° lagging ($Y_2$), $f_{in}/8$ at 180° lagging ($XB_2$), and $f_{in}/8$ at 270° lagging ($YB_2$). Second multiplexer 120-2 receives $X_2$, $Y_2$, $XB_2$, and $YB_2$ from second divide-by-two circuit 110-2, and outputs one of $X_2$, $Y_2$, $XB_2$, and $YB_2$ in accordance with a control signal received from controller 150.

Third divide-by-two circuit 110-3 receives the $f_{in}/8$ waveform from second multiplexer 120-2, divides the $f_{in}/8$ waveform by two, and outputs four phase-offset versions of the resulting $f_{in}/16$ waveform, specifically $f_{in}/16$ at 0° phase-offset ($X_3$), $f_{in}/16$ at 90° lagging ($Y_3$), $f_{in}/16$ at 180° lagging ($XB_3$), and $f_{in}/16$ at 270° lagging ($YB_3$). Third multiplexer 120-3 receives $X_3$, $Y_3$, $XB_3$, and $YB_3$ from third divide-by-two circuit 110-3, and outputs one of $X_3$, $Y_3$, $XB_3$, and $YB_3$ in accordance with a control signal received from controller 150.

A 90° phase lag at $f_{in}/4$ is equal to one cycle at $f_{in}$. Thus, control logic 150 can selectively control first multiplexer 120-1 to switch from a current waveform to a 90° lagging waveform, i.e., switching from $X_1$ to $Y_1$, $Y_1$, to $XB_1$, $XB_1$ to $YB_1$, or $YB_1$ to $X_1$, to swallow one cycle of $f_{in}$. Controller 150 can increase the division factor of frequency divider 100 by one by controlling first multiplexer 120-1 to switch to a 90° lagging waveform once each output cycle.

Figure 2:
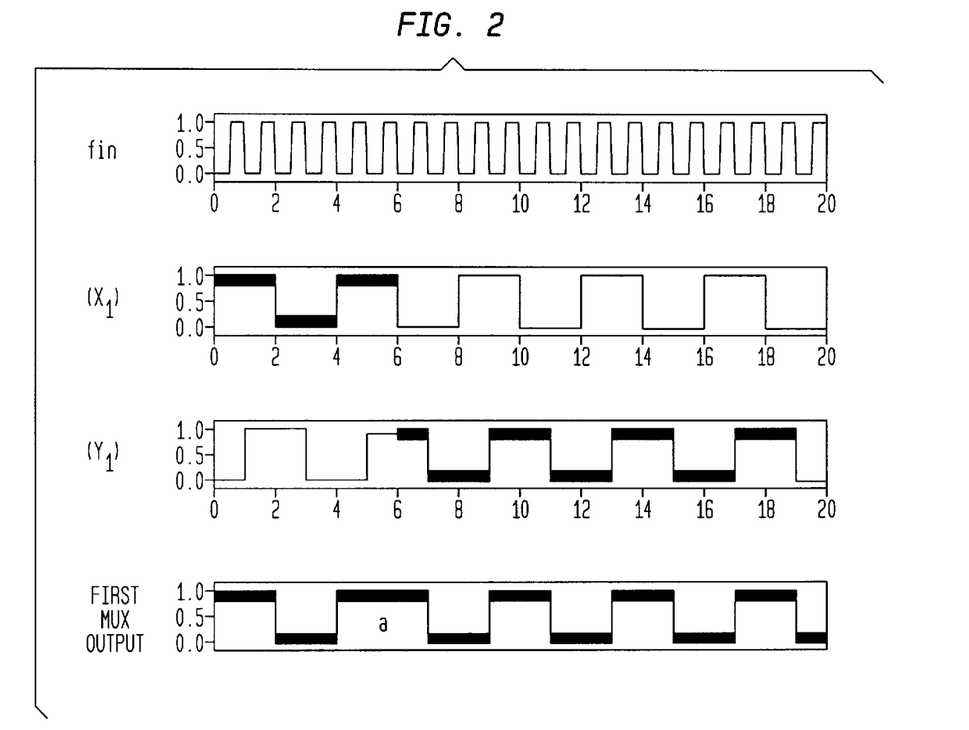
FIG. 2 shows as series of waveforms illustrating the principles of phase swallowing.

FIG. 2 shows a series of waveforms which illustrate the pulse swallowing achieved when first multiplexer 120-1 switches to a 90° lagging $f_{in}/4$ waveform. FIG. 2 shows $f_{in}$, $X_1$, $Y_1$, and an exemplary output of first multiplexer 120-1 when controller 150 controls first multiplexer 120-1 to switch from $X_1$ to $Y_1$. In each of the $X_1$ and $_1$ waveforms shown in FIG. 2, thick lines denote the time when that waveform is selected by first multiplexer 120-1, such that the waveform output by first multiplexer 120-1 is a combination of portions from $X_1$ and $Y_1$. As shown in FIG. 2, when first multiplexer 120-1 switches from $X_1$ to $Y_1$, a pulse of the final waveform, labeled pulse "a," is extended by one cycle of $f_{in}$, thereby increasing the division factor of frequency divider 100 by one if repeated once per output cycle.

A 90° phase lag at $f_{in}/8$ is equal to two cycles of $f_{in}$. Thus, controller 150 can selectively control second multiplexer 120-2 to switch from a current waveform to a 90° lagging waveform to swallow two cycles of $f_{in}$. Controller 150 can control second multiplexer 120-2 to switch from a current waveform to a 90° lagging waveform once each output cycle to increase the division factor of frequency divider 100 by two. Still further, a phase lag of 90° at $f_{in}/16$ is equal to four cycles of $f_{in}$. Thus, controller 150 can selectively control third multiplexer 120-3 to switch from a current waveform to a 90° lagging waveform to swallow four cycles of $f_{in}$. Controller 150 can control third multiplexer 120-3 to switch from a current waveform to a 90° lagging waveform once each output cycle to increase the division factor of frequency divider 100 by four.

In this manner, the number of input cycles swallowed by a switch to a 90° lagging waveform increases by a power of 2 down the chain of divide-by-two blocks, and if the controller 150 controls two or more of first, second, and third multiplexers 120-1, 120-2, and 120-3 to switch to a 90° lagging waveform during the same output cycle, the total number of cycles swallowed is equal to the sum of the individual number of cycles swallowed by each divide-by-two block, e.g., phase switching at first multiplexer 120-1 and third multiplexer 120-3 during the same output cycle swallows five additional input cycles. Thus, according to principles of the present invention, a frequency divider provides a range of least-significant frequency division increments to most-significant frequency division increments using a chain of functionally identical frequency dividers.

Controller 150 receives a plurality of control bits $b_0$, $b_1$, $b_2$ to control which of first, second, and third multiplexers 120-1, 120-2, and 120-3, if any, switch phases each output cycle. Accordingly, the division factor, D, for the exemplary frequency divider 100 structure having three divide-by-two blocks shown in FIG. 1 can be expressed as:

$$D = 2^4 + b_0 \cdot 2^0 + b_1 \cdot 2^1 + b_2 \cdot 2^2. \quad (1)$$

By varying $b_2$, $b_1$, $b_0$ from 0,0,0 to 1,1,1, division factors from 16 to 23 can be obtained. Although equation (1) assumes that a control bit of 1 indicates that a corresponding multiplexer should switch to a 90° lagging waveform each output cycle, those skilled in the art will realize that a control bit of 0 could alternatively be used to signify that a corresponding multiplexer should switch to a 90° lagging waveform.

Although frequency divider 100 of FIG. 1 includes a divide-by-two prescaler 105 and a chain of three divide-by-two blocks, frequency 100 may be easily scaled to include fewer or greater divide-by two blocks, depending on the desired division factor. For example, if a division factor greater than 32 and less than 48 is desired, frequency divider 100 will include a chain of four divide-by-two blocks, and varying control bits $b_3$, $b_2$, $b_1$, $b_0$ from 0,0,0,0 to 1,1,1,1 will achieve division factors of 32 to 47. Therefore, the division factor, D, for frequency divider 100 with M+1 divide-by-two blocks can generally be expressed as:

$$D = 2^{M+2} + b_0 \cdot 2^0 + \ldots + b_M \cdot 2^M, \quad (2)$$

and division factor from $2^{M+2}+2$ to $2^{M+2}+2^{M+1}-1$ can be achieved by varying $b_M, \ldots, b_0$ from all 0's to all 1's (or vice versa).

Figure 3:
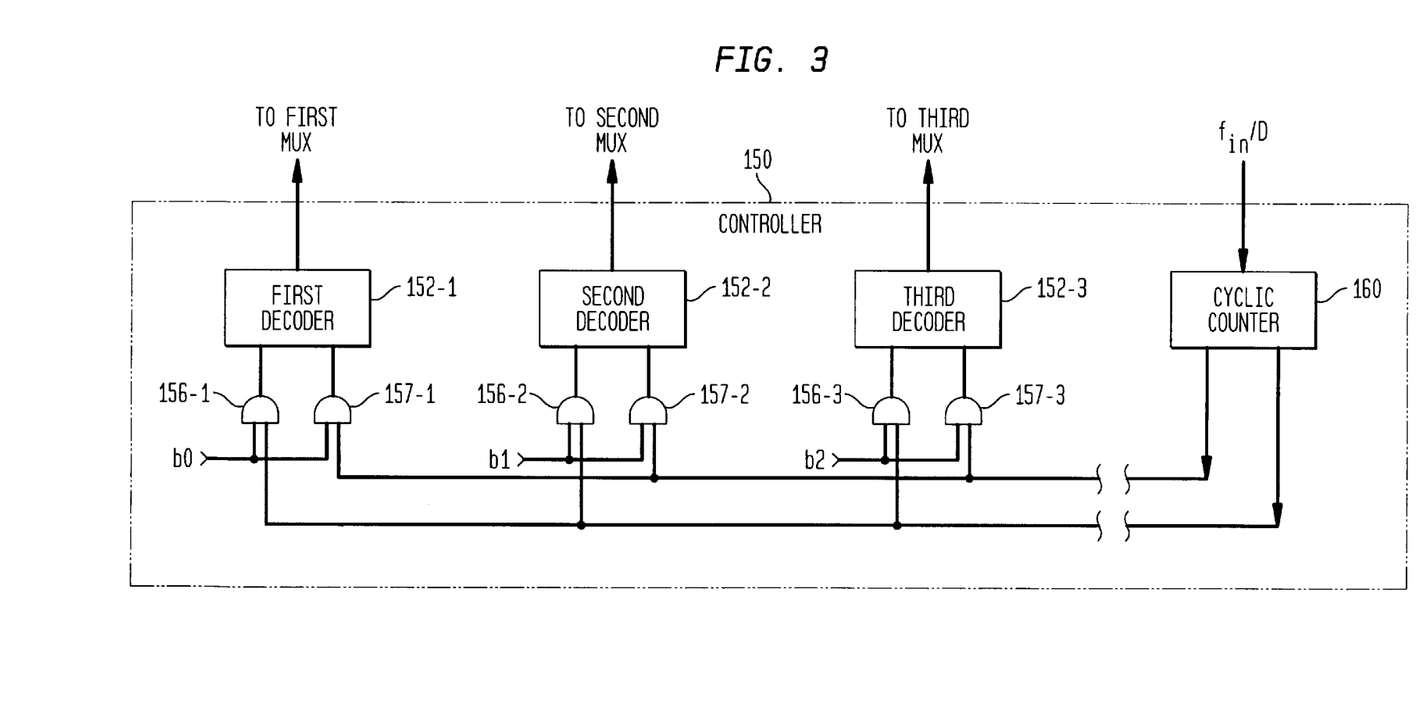
FIG. 3 shows an exemplary control logic structure which controls phase shifts for the frequency divider structure of FIG. 1 in accordance with the principles of the invention.

FIG. 3 shows an exemplary configuration for controller 150 which controls first, second, and third multiplexers 120-1, 120-2, and 120-3 in accordance with control bits $b_0$, $b_1$, and $b_2$ respectively. Controller 150 includes i) first, second, and third decoders 152-1, 152-2, 152-3, ii) first, second, and third high-order bit AND gates 156-1, 156-2, 156-3, iii) first, second, and third low-order bit AND gates 157-1, 157-2, 157-3, and iv) cyclic counter 160. In this exemplary configuration, cyclic counter 160 is a four-state counter, e.g., for counting in a two-bit gray-code sequence of 00, 01, 11, 10, which increments at each output cycle of $f_{in}/D$. Cyclic counters have been used in prior art frequency dividers and are well known in the art. Any suitable counter circuit can be used for cyclic counter 160.

First decoder 152-1 receives outputs from first high-order bit AND gate 156-1 and first low-order bit AND gate 157-1 and converts the resulting two bits to a multiplexer command, such that decoder 152-1 commands first multiplexer 120-1 to output one of $X_1$, $Y_1$, $XB_1$, and $YB_1$. Second decoder 152-2 receives outputs from second high-order bit AND gate 156-2 and second low-order bit AND gate 157-2 and converts the resulting two-bits to a multiplexer command, such that decoder 152-2 commands second multiplexer 120-2 to output one of $X_2$, $Y_2$, $XB_2$, $YB_2$. Third decoder 152-3 receives outputs from third high-order bit AND gate 156-3 and third low-order bit AND gate 157-3 and converts the resulting two bits to a multiplexer command, such that third decoder 152-3 commands third multiplexer 120-3 to output one of $X_3$, $Y_3$, $XB_3$, $YB_3$.

Decoders which convert a cyclic counter output to a multiplexer control signal have been used in prior art frequency dividers, and are well known. First, second, and third decoders 152-1, 152-2, and 152-3 may be any suitable decoder. Furthermore, first, second, and third decoders 152-1, 152-2, 152-3 may be a decoding and retiming device such as that we disclosed in N. Krishnapura & P. Kinget, *A 5.3 GHz Programmable Divider For HiPerLAN in 0.25 μm CMOS*, Proceedings of the 25$^{th}$ European Solid State Circuit Conference. (ESSCIRC), pp. 142–45, September, 1999, which provides "glitch free" switching, i.e., the corresponding multiplexer is controlled to switch to a lagging waveform when both the lagging waveform and the previously selected waveform are at the same level ("high" or "low").

As an example of the operation of first, second, and third decoders 152-1, 152-2, and 152-3, each decoder may send: an $X_1$-, $X_2$-, $X_3$-select command to first, second, and third multiplexers, 120-1, 120-2, and 120-3 respectively, upon receiving 00; a $Y_1$-, $Y_2$-, $Y_3$-select command to first, second, and third multiplexers 120-1, 120-2, and 120-3 respectively, upon receiving 01; an $XB_1$-, $XB_2$-, $XB_3$-select command to first, second, and third multiplexers 120-1, 120-2, and 120-3 respectively, upon receiving 11; and a $YB_1$-, $YB_2$-, $YB_3$-select command to first, second, and third multiplexers 120-1, 120-2, and 120-3 respectively, upon receiving 10.

First high-order bit AND gate 156-1 and first low-order bit AND gate 157-1 each receive first control bit $b_0$; second high-order bit AND gate 156-2 and second low-order bit AND gate 157-2 each receive second control bit $b_1$; and third high-order bit AND gate 156-3 and third low-order bit AND gate 157-3 each receive third control bit $b_2$. When first control bit $b_0$ is set to 0, first decoder 152-1 receives 00 and sends an $X_1$-select command to first multiplexer 120-1; when second control bit $b_1$ is set to 0, second decoder 152-2 receives 00 and sends an $X_2$-select command to second multiplexer 120-2; and when third control bit $b_2$ is set to 0, third decoder 152-3 receives 00 and sends an $X_3$-select command to third multiplexer 120-3.

First, second, and third high-order bit AND gates 156-1, 156-2, 156-3 each also receive the first bit output from cyclic counter 160, and first, second, and third low-order bit AND gates 157-1, 157-2, 157-3 each receive the second bit output from cyclic counter 160. As a result, when cyclic counter 160 outputs 00, first, second, and third decoders 152-1, 152-2, and 152-3 receive 00 (X-select) regardless of control bits $b_0$, $b_1$, $b_2$. When cyclic counter 160 outputs 01, first, second, and third decoders 152-1, 152-2, and 152-3 receive 01 (Y-select command) when the corresponding control bit $b_0$, $b_1$, $b_2$ is also 1; when cyclic counter 160 outputs 11, first, second, and third decoders 152-1, 152-2, and 152-3 receive 11 (XB-select command) when the corresponding control bit $b_0$, $b_1$, $b_2$ is also 1; and when cyclic counter 160 outputs 10, first, second, and third decoders 152-1, 152-2, and 152-3 receive 10 (YB-select command) when the corresponding control bit $b_0$, $b_1$, $b_2$ is also 1. Accordingly, first multiplexer 120-1 switches to a 90° lagging waveform each cycle of $f_{in}/D$, i.e., each time cyclic counter 160 increments, when control bit $b_0$ is 1. Likewise, second multiplexer 120-2 switches to a 90° lagging waveform each cycle of $f_{in}/D$ when control bit $b_1$ is 1, and third multiplexer 120-3 switches to a 90° lagging waveform each cycle of $f_{in}/D$ when control bit $b_2$ is 1. In accordance with the control logic configuration shown in FIG. 3, only control bits $b_0$, $b_1$, $b_2$ need to be changed when a new division factor within a certain range is selected, and the logic circuitry can be easily scaled to include additional or fewer divide-by-two blocks and control bits to provide a higher or low range of possible division factors.

As is evident from the above discussion, certain division factors are not achieved using the configuration of controller 150 shown in FIG. 3. For example, the maximum division factor achieved by a divide-by-two prescaler and a chain of two divide-by-two blocks is 11, i.e., $D=2 \cdot 3^3 + b_1 \cdot 2^0 + b_1 \cdot 2^1$, but the minimum division factor for a configuration with a divide-by-two prescaler and a chain of three divide-by-two blocks with pulse swallowing capability is 16.

We have recognized that such gaps can be filled by selectively controlling the last divide-by-two block to switch to a 90° phase-leading waveform, instead of a 90° phase-lagging waveform, once per output cycle. In this way, the last multiplexer shortens instead of elongates the output cycle to make division factors smaller than $2^{M+2}$ possible.

Figure 4:
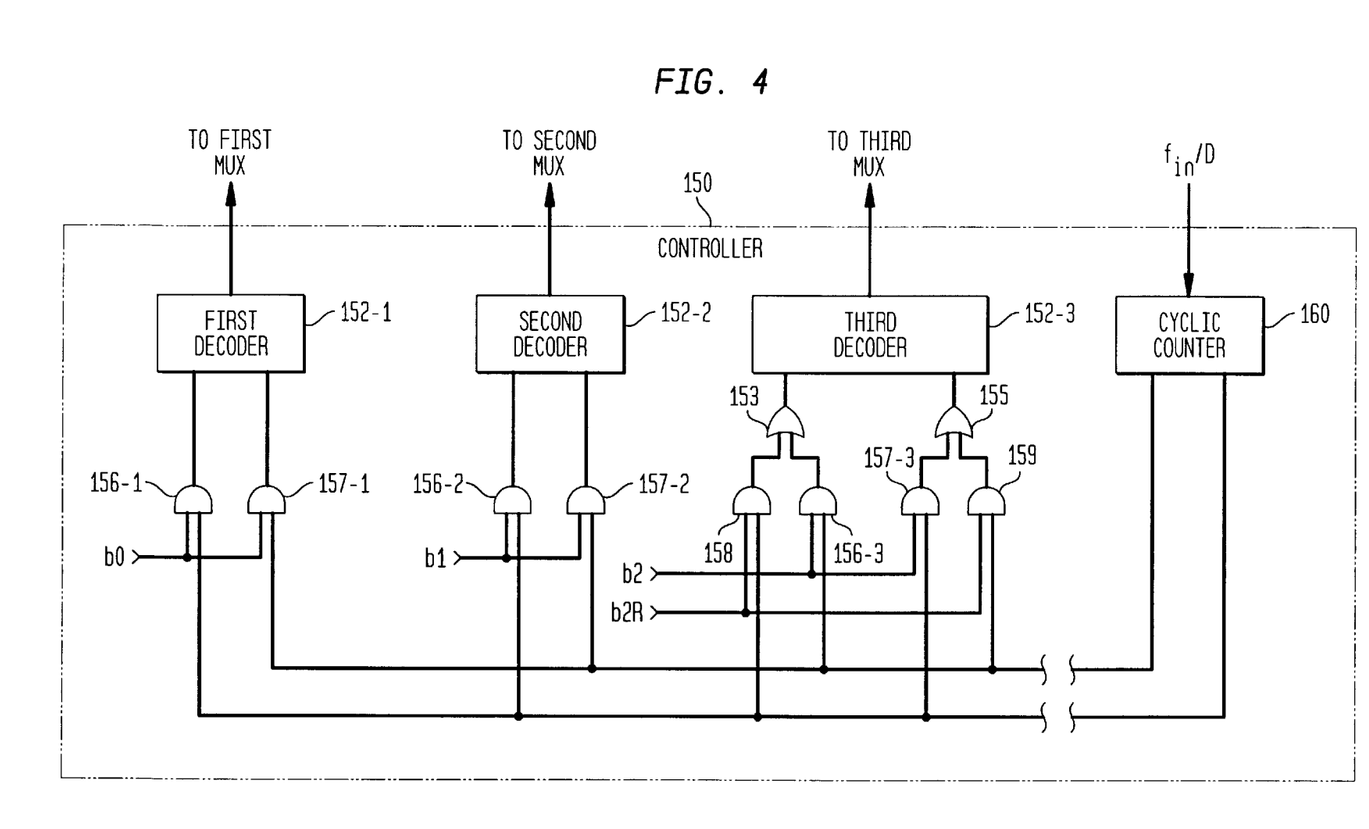
FIG. 4 shows an exemplary control logic structure for the frequency divider of FIG. 1 which controls forward and reverse phase shifts in the last divide-by-two block to increase the number of possible division factors in accordance with the principles of the present invention.

FIG. 4 shows an exemplary configuration of controller 150 for selectively controlling the last multiplexer of frequency divider 100 to switch to a 90° phase-leading waveform once per output cycle when a division factor of 11 to 15 is desired. In addition to the elements described above with reference to FIG. 3, controller 150 shown in FIG. 4 includes high-order bit OR gate 153, low-order bit OR gate 155, high-order reverse count AND gate 158, and low-order reverse count AND gate 159. High-order reverse count AND gate 158 and low-order reverse count AND gate 159 each receive control bit $b_{2R}$, which is set to 1 when third multiplexer 120-3 should switch to a 90° phase-leading waveform once per output cycle, i.e., for division factors of 12 to 15. Low-order reverse count AND gate 159 also receives the high-order bit from cyclic counter 160, and high-order reverse count AND gate 158 also receives the low-order bit from cyclic counter 160.

High-order bit OR gate 153 receives the outputs of third high-order bit AND gate 156-3 and high-order reverse count AND gate 158, and has an output connected to third decoder 152-3. Low-order bit OR gate 155 receives the outputs of third low-order bit AND gate 157-3 and low-order reverse count AND gate 159, and has an output connected to third decoder 152-3. Therefore, third decoder 152-3 receives a two-bit control code from high-order bit OR gate 153 and low-order bit OR gate 155 for the configuration of controller 150 shown in FIG. 4. With this logic configuration, third decoder 152-3 will control third multiplexer 120-3 to switch to a 90° phase-leading waveform, i.e., $X_3$ to $YB_3$, $YB_3$ to $XB_3$, $XB_3$ to $Y_3$, or $Y_3$ to $X_3$, when control bit $b_{2R}$ is 1 each time cyclic counter 160 increments, thereby resulting in a division factor of 12 to 15, depending on control bits $b_1$, $b_0$. Control bit sequence $b_{2R}$, $b_1$, $b_0$=1,1,1 provides a division factor of 15, $b_{2R}, b_1, b_0=1,1,0$ provides a division factor of 14, $b_{2R}, b_1, b_0=1,0,1$ provides a division factor of 13, and $b_{2R}, b_1, b_0=1,0,0$ provides a division factor of 12. When control bit $b_{2R}$ is 0, the configuration of control logic 150 shown in FIG. 4 operates like that shown in FIG. 3 to achieve division factors of 16 to 23 based on control bits $b_2$, $b_1$, $b_0$. In accordance with the principles of the present invention described above with reference to FIG. 4, division factors in the range of $2^{M+1}+2^M$ to $2^{M+2}-1$ can be achieved by controlling the last divide-by-two block to switch to a 90° phase-leading waveform each output cycle by setting control bit $b_{MR}$ to 1 and varying control bits $b_{M-1}, \ldots, b_0$ from $0, \ldots, 0$ to $1, \ldots, 1$. If $b_{MR}$ is set to 1, $b_M$ should not also be set to 1.

Figure 5:
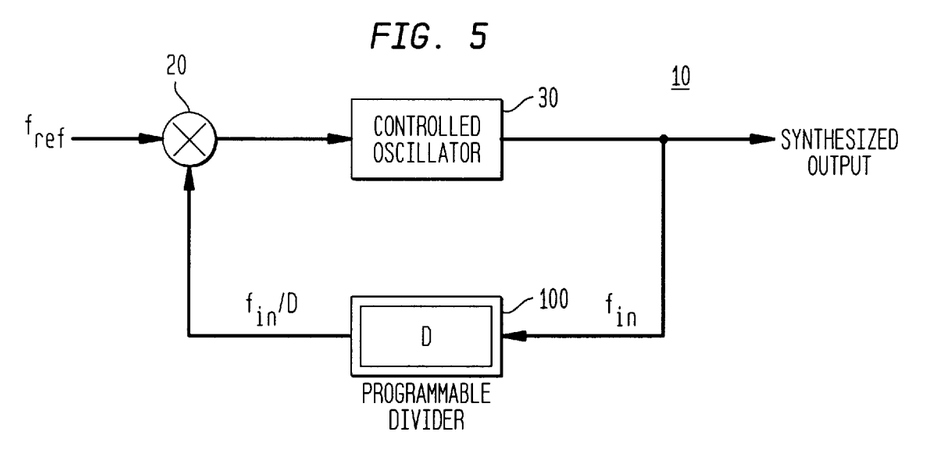
FIG. 5 shows an exemplary PLL frequency synthesizer which incorporates a frequency divider in accordance with the principles of the present invention.

FIG. 5 shows an exemplary PLL frequency synthesizer 10 which includes a programmable frequency divider according to the principles of the present invention. PLL frequency synthesizer 10 includes I) phase detector 20, II) controlled oscillator 30, and III) a programmable frequency divider 100 according to the principles of the present invention. As described above, programmable frequency divider 100 divides an input frequency, $f_{in}$, by a division factor, D. Phase detector 20 receives the output of programmable frequency divider 100 and a reference frequency, $f_{ref}$, detects phase differences between $f_{ref}$ and $f_{in}/D$, and outputs an error signal. Controlled oscillator 30, e.g., a voltage controlled oscillator (VCO), receives the error signal output by phase detector 20, such that the frequency of the signal output by controlled oscillator 30 is corrected based on the error signal output of phase detector 20.

The foregoing merely illustrates the principles of the invention. It will be appreciated that those skilled in the art will be able to devise various arrangements which, although not explicitly described or shown herein, embody the principles of the invention and are thus within the spirit and scope.

We claim:

1. A programmable frequency divider comprising:
   a chain of frequency divider blocks, each frequency divider block having
      a frequency divider which scales a frequency of an input waveform to generate a scaled frequency waveform, and outputs multiple phase-offset versions of said scaled frequency waveform, and
      a multiplexer for selecting one of said multiple phase-offset versions of said scaled frequency waveform; and
   wherein said multiplexer of each frequency divider block selects a current phase-offset version of said scaled frequency waveform or a different phase-offset version of said scaled frequency waveform based on a selected division factor.

2. The invention as defined in claim 1, further comprising:
   a pre-scaler for receiving a reference frequency waveform, dividing said reference frequency waveform by a pre-scaling factor, and outputting a pre-scaled waveform to a first frequency divider block of said chain of frequency divider blocks.

3. The invention as defined in claim 2, wherein said programmable frequency divider has a base division factor of $2^{M+2}$, said programmable frequency divider achieving said base division factor when said multiplexer of each frequency divider block selects said current phase-offset version of said scaled frequency waveform, M+1 being the number of frequency divider blocks in said chain of frequency divider blocks.

4. The invention as defined by claim 1, wherein said multiplexer selects a phase-lagging version of said scaled frequency waveform to increase a division factor achieved by said programmable frequency divider by an incremental division factor.

5. The invention as defined by claim 4, wherein each frequency divider block in said chain of frequency divider blocks has an associated weighted incremental division factor, such that the incremental division factor associated with a given frequency divider block increases moving down said chain of frequency divider blocks.

6. The invention as defined by claim 5, wherein
   said programmable frequency divider further comprises a divide-by-two pre-scaler, and
   said division factor, D, of said programmable frequency divider can be represented as:

$$D = 2^{M+2} + b_0 \cdot 2^0 + \ldots + b_M \cdot 2^M,$$

where said chain of frequency divider blocks includes M+1 frequency divider blocks, and $b_0, \ldots, b_M$ are control bits which respectively indicate whether a first, $\ldots$, M+1$^{th}$ frequency divider block should achieve its associated incremental division factor.

7. The invention as defined in claim 6, wherein said multiplexer of one frequency divider block of said chain of frequency divider blocks selects a phase-leading version of said reduced frequency waveform to achieve a division factor less than $2^{M+2}$.

8. The invention as defined in claim 4, wherein
   said frequency divider of each frequency divider block outputs a 0° phase-offset version of said scaled frequency waveform, a 90° phase-offset version of said scaled frequency waveform, a 180° phase-offset version of said scaled frequency waveform, and a 270° phase-offset version of said scaled frequency waveform, and
   said multiplexer sequentially switches from said 0° phase-offset version to said 90° phase-offset version, from said 90° phase-offset version to said 180° phase-offset version, from said 180° phase-offset version to said 270° phase-offset version, and from said 270° phase-offset version to said 0° phase-offset version to achieve the incremental division factor associated with the corresponding frequency divider block.

9. The invention as defined in claim 1, wherein said programmable frequency divider further comprises a controller for designating selections made by said multiplexer of each frequency divider block.

10. The invention as defined in claim 9, wherein said controller includes a cyclic counter for receiving an output from a last frequency divider block in said chain of frequency divider blocks, incrementing a count value each cycle of said output from said last frequency divider block, and outputting said count value to said controller.

11. The invention as defined in claim 9, wherein said controller receives a single control bit for each frequency divider block in said chain of frequency divider blocks, said control bit indicating whether said multiplexer selects a current phase-offset version of said scaled frequency waveform or a different phase-offset version of said scaled frequency waveform.

12. The invention as defined in claim 9, wherein said controller includes a plurality of decoders, one for each frequency divider block in said chain of frequency divider blocks, each decoder converting a two bit command signal into a multiplexer command signal.

13. The invention as defined in claim 10, wherein, when said controller controls said multiplexer to select a different phase-offset version of said scaled frequency waveform, said controller controls said multiplexer to select a different phase-offset version of said scaled frequency waveform once per cycle of said output from said last frequency divider block based on said count value output by said cyclic counter.

14. The invention as defined in claim 1, wherein, when said multiplexer selects a different phase-offset version of said scaled frequency waveform, said multiplexer selects a different phase-offset version of said scaled frequency waveform once per cycle of an output from a last frequency divider block in said chain of frequency divider blocks.

15. The invention as defined in claim 1, wherein said frequency divider of each frequency divider block is a divide-by-two circuit.

16. The invention as defined in claim 1, wherein the multiplexer of one frequency divider block of said chain of frequency divider blocks selects a phase-leading version of said scaled frequency waveform.

17. A phase-lock loop frequency synthesizer comprising:
a programmable frequency divider which includes
a chain of frequency divider blocks for generating an output waveform, each frequency divider block having
a frequency divider which scales a frequency of an input waveform to generate a scaled frequency waveform, and outputs multiple phase-offset versions of said scaled frequency waveform, and
a multiplexer for selecting one of said multiple phase-offset versions of said scaled frequency waveform, and
wherein said multiplexer of each frequency divider block selects a current phase-offset version of said scaled frequency waveform or a different phase-offset version of said scaled frequency waveform based on a selected division factor;
a phase detector for detecting a phase difference between an output of said programmable frequency divider and a reference signal; and
an oscillator for generating an oscillating signal based on an output of said phase detector.

18. The invention as defined in claim 17, wherein said programmable frequency divider further includes a pre-scaler for receiving a reference frequency waveform, dividing said reference frequency waveform by a pre-scaling factor, and outputting a pre-scaled waveform to a first frequency divider block of said chain of frequency divider blocks.

19. The invention as defined in claim 18, wherein said programmable frequency divider has a base division factor of $2^{M+2}$, said programmable frequency divider achieving said base division factor when said multiplexer of each frequency divider block selects said current phase-offset version of said scaled frequency waveform, M+1 being the number of frequency divider blocks in said chain of frequency divider blocks.

20. The invention as defined in claim 17, wherein said programmable frequency divider further includes a controller for designating selections.

21. The invention as defined in claim 20, wherein said controller includes a cyclic counter for receiving an output from a last frequency divider block in said chain of frequency divider blocks, incrementing a count value each cycle of said output from said last frequency divider block in said chain of frequency divider blocks, and outputting said count value to said controller.

22. The invention as defined in claim 21, wherein, when said controller controls said multiplexer to select a different phase-offset version of said scaled frequency waveform, said controller controls said multiplexer to select a different phase-offset version of said scaled frequency waveform once per cycle of said output from said last frequency divider block based on said count value output by said cyclic counter.

23. The invention as defined in claim 17, wherein, when said multiplexer selects a different phase-offset version of said scaled frequency waveform, said multiplexer selects a different phase-offset version of said scaled frequency waveform once per cycle of an output from a last frequency divider block in said chain of frequency divider blocks.

24. The invention as defined in claim 20, wherein said controller receives a single control bit for each frequency divider block in said chain of frequency divider blocks, said control bit indicating whether said multiplexer selects a current phase-offset version of said scaled frequency waveform or a different phase-offset version of said scaled frequency waveform.

25. The invention as defined in claim 20, wherein said controller includes a plurality of decoders, one for each frequency divider block in said chain of frequency divider blocks, each decoder converting a two-bit command signal into a multiplexer command signal.

26. The invention as defined in claim 17, wherein said frequency divider of each frequency divider block is a divide-by-two circuit.

27. The invention as defined by claim 17, wherein said multiplexer selects a phase-lagging version of said scaled frequency waveform to increase a division factor achieved by said programmable frequency divider by an incremental division factor.

28. The invention as defined by claim 27, wherein each frequency divider block in said chain of frequency divider blocks has an associated weighted incremental division factor, such that the incremental division factor associated with a given frequency divider block increases moving down said chain of frequency divider blocks.

29. The invention as defined by claim 28, wherein
said programmable frequency divider further includes a divide-by-two pre-scaler, and
said division factor, D, of said programmable frequency divider can be represented as:

$$D=2^{M+2}+b_0 \cdot 2^0 + \ldots b_M \cdot 2^M,$$

where said chain of frequency divider blocks includes M+1 frequency divider blocks, and $b_0, \ldots, b_M$ are control bits which respectively indicate whether a first, ..., M+1$^{th}$ frequency divider block should achieve its associated incremental division factor.

30. The invention as defined in claim 29, wherein said multiplexer of one frequency divider block of said chain of frequency divider blocks selects a phase-leading version of said reduced frequency waveform to achieve a division factor less than $2^{M+2}$.

31. The invention as defined in claim 27, wherein said frequency divider of each frequency divider block outputs a 0° phase-offset version of said scaled frequency waveform, a 90° phase-offset version of said scaled frequency waveform, a 180° phase-offset version of said scaled frequency waveform, and a 270° phase-offset version of said scaled frequency waveform, and said multiplexer sequentially switches from said 0° phase-offset version to said 90° phase-offset version, from said 90° phase-offset version to said 180° phase-offset version, from said 180° phase-offset version to said 270° phase-offset version, and from said 270° phase-offset version to said 0° phase-offset version to achieve the incremental division factor associated with the corresponding frequency divider block.

32. The invention as defined in claim 17, wherein the multiplexer of one frequency divider block of said chain of frequency divider blocks selects a phase-leading version of said scaled frequency waveform.

* * * * *